United States Patent [19]
Polese

[11] Patent Number: 5,878,322
[45] Date of Patent: Mar. 2, 1999

[54] HEAT-DISSIPATING SUBSTRATE FOR MICRO-ELECTRONIC DEVICES AND FABRICATION METHOD

[76] Inventor: Frank J. Polese, 1185 Novara St., San Diego, Calif. 92107

[21] Appl. No.: 947,478

[22] Filed: Oct. 10, 1997

Related U.S. Application Data

[63] Continuation-in-part of Ser. No. 654,974, May 28, 1996, Ser. No. 459,700, continuation-in-part of PCT/US94/04814, May 9, 1994, abandoned, and Ser. No. 64,255, May 20, 1993, Pat. No. 5,413,751, which is a continuation-in-part of Ser. No. 46,635, Apr. 14, 1993, abandoned.

[51] Int. Cl.$^6$ ........................................... B22F 3/12
[52] U.S. Cl. ................ 419/38; 419/39; 419/30; 419/47
[58] Field of Search ................... 419/39, 47, 35, 419/38, 30

[56] References Cited

U.S. PATENT DOCUMENTS

| | | |
|---|---|---|
| 3,576,619 | 4/1971 | Emley . |
| 5,049,184 | 9/1991 | Harner et al. ........................ 75/246 |
| 5,413,751 | 5/1995 | Polese et al. ........................ 419/23 |
| 5,439,638 | 8/1995 | Houck et al. ........................ 419/30 |

*Primary Examiner*—Ngoclan Mai
*Attorney, Agent, or Firm*—Henry J. A. Charmasson; John D. Buchaca

[57] ABSTRACT

Heatsinks for microcircuit packages are formed by first mold-pressing a composite powder of free-flowing spray-dried particles of copper and at least one other denser material such as tungsten and/or molybdenum breakably agglutinated in nodules grouping sub-nodules of surface alloyed pairs of particles of each metal, the proportions of which are adjusted to match the thermal expansion characteristics of the microcircuit material. The pressed compacts are then heated in a sintering furnace at 1090° C. to 1150° C. in order to effect an homogeneous distribution of the melting copper throughout the structure. The process results in a readily usable component having good thermal conductivity and matched thermal expansion that requires no further machining.

18 Claims, 2 Drawing Sheets

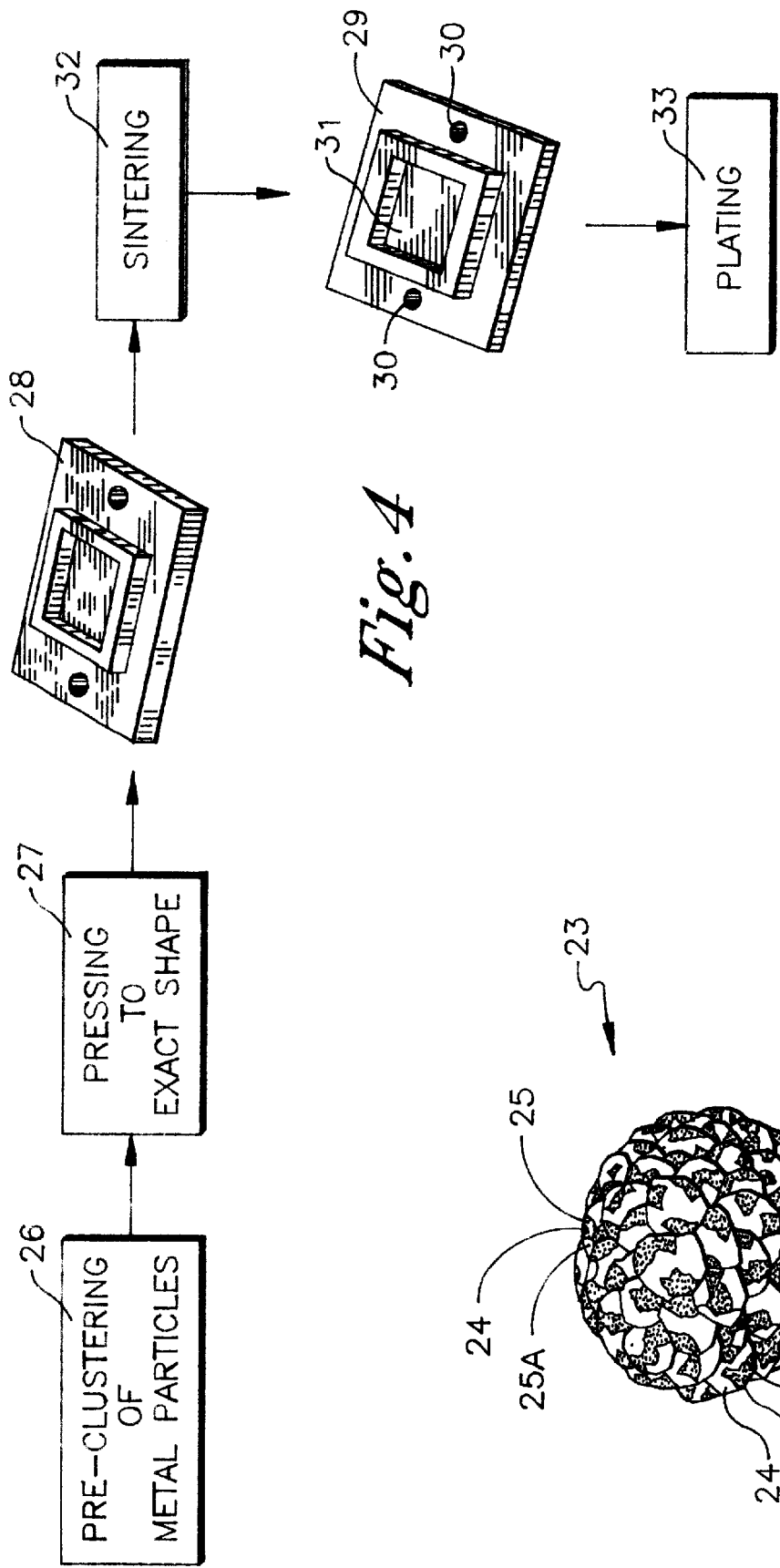

HEAT-DISSIPATING SUBSTRATE FOR MICRO-ELECTRONIC DEVICES AND FABRICATION METHOD

PRIOR APPLICATION

This is a continuation-in-part application of copending application Ser. No. 08/654,974 filed May 28, 1996, a continuation-in-part Ser. No. 08/459,700 filed Jun. 2, 1995, now abandoned, a continuation-in-part of PCT/US94/04814 filed May 9, 1994, now abandoned, a continuation-in-part of Ser. No. 08/064,255 filed May 20, 1993, now U.S. Pat. No. 5,413,751 dated May 9, 1995 which was a continuation-in-part of Ser. No. 08/046,635 filed Apr. 14, 1993, now abandoned.

FIELD OF THE INVENTION

This instant invention relates to powder metallurgy and to the fabrication of microcircuit packages, and more specifically to the manufacture of heat-dissipating components having a coefficient of the thermal expansion compatible with the material used in the fabrication of microcircuits.

BACKGROUND OF THE INVENTION

The invention offers an improvement to the method for making heat-dissipating elements for microelectronic devices disclosed in U.S. Pat. No. 5,413,751 Polese et al., which patent is incorporated herein and made part of the present disclosure by this reference.

The aforesaid patent taught a novel and non-obvious process illustrated in FIG. 1 in the manufacture of heat-dissipating components by powder metallurgy. The process began with preclustering 10 the metal particles of metal having different densities and melting points to yield a free-flowing composite powder that allowed direct pressing 11 and sintering 12 of a powder compact 13 into the near-shape of the desired component 14. The invention avoided the time-consuming and expensive processes of cutting and machining the components from a composite block made by the prior art copper-infiltration process as disclosed in U.S. Pat. No. 4,680,618 Kurada et al. However, components made according to the aforesaid method have been found to exhibit surface accumulation of copper. It appears that during the sintering process, copper bleeds out of the outer layer of the compact due to an excessive capillarity phenomenon and concentrate on the periphery of the component. The excess copper tends to cause plating blisters during the brazing process, severely affect the coefficient of thermal expansion at the surface of the heat-dissipating component.

In spite of the grinding and lapping, remaining porous surface areas from which the copper had bled away would occasionally cause pitting during the plating process.

It was found necessary to remove the excess copper by abrasion and even grind away the subcutaneous layer from which the bleeding copper had been drawn. Thus, the heat-sink element could only be pressed and sintered to a near-net shape, preferably slightly oversize. Their top and bottom surfaces must then be ground 15, their sides lapped 16 down to net shape and holes and cavities 19 machined 17 before plating 18.

The instant invention results from a search for a more efficient process that avoids the surface bleeding of the copper.

SUMMARY OF THE INVENTION

Free-flowing powders of pre-clustered nodules of copper and tungsten (or molybdenum) used in the fabrication of composite heat-dissipating components for the microelectronic industry have been, until now, of a type where each nodule comprises a grouping of sub-nodules 20 wherein each sub-nodule includes a core 21 made of the denser metal (tungsten or molybdenum) surrounded by a blanket of smaller particles 22 of a lighter metal metal (copper) as illustrated in FIG. 2.

The object of the invention is to eliminate the copper bleeding phenomenon observed during the sintering phase by using a free-flowing powder of nodules each comprising an agglutinate of sub-nodules wherein each sub-nodule includes at least one first metal particle and at least one by particle of a second metal having higher melting point as illustrated in FIG. 3. Within each nodule, the sub-nodules are breakably agglutinated by a binder. Within each sub-nodule the particles are paired by surface alloying occurring during the fabrication process. The desired proportion of the first metal to the second metal is determined by the relative size or weight of the particles of each sub-nodule. When this type of powder is compacted into a body, and the body sintered at a temperature slightly above the melting point of copper, the capillary creep of the melting copper particle is partially constrained by the surrounding particles of the non-melted metal, and the bleeding phenomenon that affected the prior art process is eliminated.

As the pre-clustered nodule powder taught in the referenced Polese et al. patent, powders of such type are commerically available from Sylvania of Towanda, Pa. for use in the manufacture of highly conductive but wear-resistant electrical contact surfaces in switches and circuit-breakers.

Another object of the invention is to simplify and expedite the manufacturing process of the heat-dissipating components by eliminating the grinding and steps necessary to remove the bleeding layer formed under the prior art process, and by directly pressing the compact to the desired size component, including holes and cavities.

BRIEF DESCRIPTION OF THE DRAWING

FIG. 3 is a diagrammatical illustration of the metal powder cluster according to the invention; and FIG. 4 is a block diagram illustration of the manufacturing process according to the invention.

DESCRIPTION OF THE PREFERRED EMBODIMENT OF THE INVENTION

Figure 1:
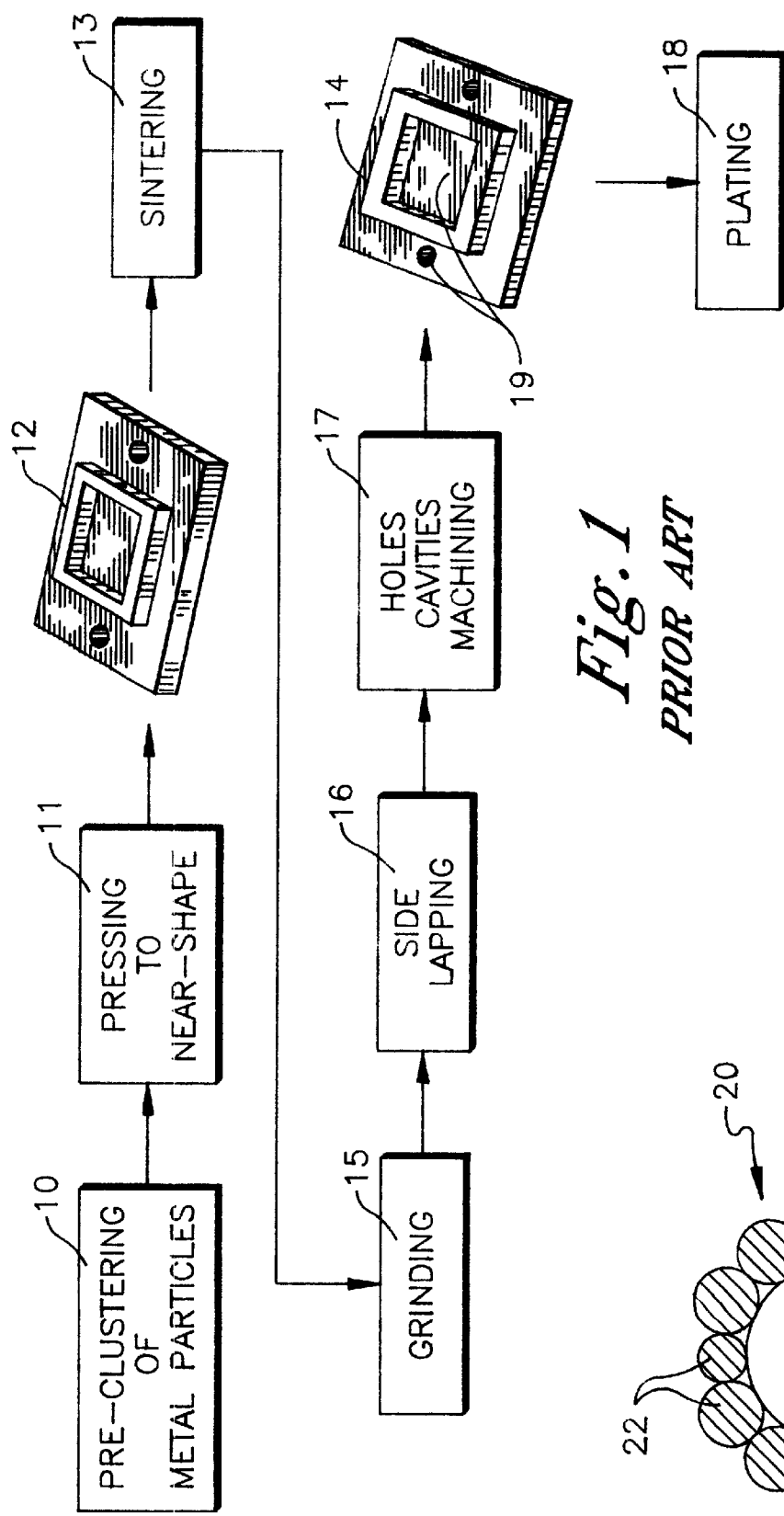
FIG. 1 is a block diagram illustrating the prior art manufacturing process.
Figure 2:
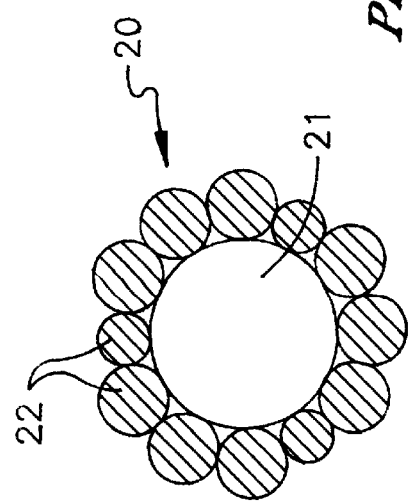
FIG. 2 is a diagrammatical illustration of a prior art metal powder cluster.

In accordance with the invention, a volume of free-flowing sintering powder made of clusters of agglomerated particles of at least two metals is pressed into a compact having the exact desired shape and dimensions of the heat-dissipating component for use in the manufacture of microcircuits devices. A first type of particle is made of a metal or alloy having coefficient of thermal conductivity of at least 200 W/m °K. and a melting point of less than 1,500° C. such as aluminum, copper, silver, gold and alloys thereof.

A second type of particle is made of a metal or alloy having a coefficient of thermal expansion of less than $10^{-5}/°C$. Tungsten and molybdenum are preferred choices that can be used singly or together. These metals exhibit a higher density than those of the first type, except for silver and gold, and a much higher melting point. They also have lesser coefficients of thermal conductivity and thermal expansion.

By adjusting the weight ratio of the first type to the second type of metals in each sub-nodule within a range of between approximately 5% to 30%, one can create a sintered component having a coefficient of thermal expansion closely matched to that of the semiconductor material in contact with the heat-dissipating component in the microcircuit device. These coefficients of thermal expansion within a range between $5 \times 10^{-6}/°C$ and $11 \times 10^{-6}/°C$.

The powder of cluster particles is formed according to a proprietary process developed by SYLVANIA of Towanda, Pa. as disclosed in part in U.S. Pat. No. 5,439,638 Houck et al, which patents are incorporated in this specification by this reference. The powders are commercially available from that company. More specifically, the powders used in the practice of the invention are designated as Type III Powder Electronic Grade, and are characterized by nodules 23 formed by an agglutination of sub-nodules 24 wherein each sub-nodule groups at least one particle 25 of the first type of metal and at least one by particle 25A of the second metal having a higher melting point as illustrated in FIG. 3. The diameters of the nodule range between 40 and 350 microns. The diameter of the particles range between 0.5 and 7 microns.

FIG. 4 illustrates the simplified process of the invention.

A volume of powder, grouping the selected particles preclustered according to the aforesaid proprietary process 26 is pressed 27 into a compact 28 having the exact shape and dimensions of the desired heat-dissipating component 29. The pressing is done under a pressure within a range of approximately 1,350 to 3,400 atmospheres (20,000 to 50,000 lbs/in$^2$). It should be noted that the compact may have all the through-holes 30 and surface cavities 31 desired in the final product 29.

The compact is sintered 32 under ambient pressure at a temperature slightly above the melting point of the first type of metal. Typically, between 1,090° C. and 1,230° C. if that metal is copper. The sintered body 29 is usually plated 33 with gold and nickel prior to sale without having to to grind, side-lap or machine it.

Particles of nickel, cobalt, carbide and other metals may be added and totally mixed with the volume of powder in order to impact other specific characteristics to the final product.

EXAMPLE

A copper and tunsten powder available from SYLVANIA under the designation TUNGSTAR Type III was selected that contained approximately 15% copper and 85% tungsten by weight (27.7% and 72.3% per volume). The powder mixture consisted of particles of metal averaging 0.6 to 2.5 microns in diameter.

The mixture was pressed-molded at room temperature under 3,000 atmospheres (44,000 lbs/in$^2$) into the final shape of the desired heat-dissipating microcircuit component. The resulting "green" compacts were placed in a sintering furnace and subjected to temperatures of 1,100° C. for 180 minutes under ambient atmospheric pressure.

After cooling, the final article exhibited a specific gravity of 98% of the theoretical gravity of a perfectly solid composite, and high homogeneity.

No surface bleeding of the copper could be observed on the surface of the device.

The components were electrically plated with nickel and gold in order to harden their surface and facilitate brazing of microelectronic components thereon. The heat-dissipating component exhibited a coefficient of thermal expansion of $6.5 \times 10^{-6}/°C$.

Other heat-dissipating components were made with powder having a ratio of copper to tungsten varying between 5 to 25 according to the same process. Their coefficients of thermal expansion were measured to range between $5 \times 10^{-6}/°C$ and $12 \times 10^{-6}/°C$. Those ranges were sufficient to match the thermal expansion coefficients of most microelectronic components while retaining a coefficient of thermal conductivity between 140 and 200 W/m °K.

While the preferred embodiments of the invention have been described, modifications can be made and other embodiments may be devised without departing from the spirit of the invention and the scope of the appended claims.

What is claimed is:

1. A process for manufacturing to a desired shape and dimensions, an homogeneous heat-dissipating component of microelectric devices which comprises:

selecting a free-flowing powder of agglomerated nodules of a first metal and of a second metal having a lower coefficient of thermal expansion and higher melting point than said first metal, wherein each of said nodules comprises an agglutination of sub-nodules wherein each of said sub-nodules include at least one particle of said first metal and at least one particle of said second metal bonded together;

pressing a volume of said powder into a compact; and sintering said compact at a temperature sufficient to melt said first metal into a composite body having said desired shape and dimensions.

2. The process of claim 1, wherein said step of pressing comprises shaping said compact to said desired shape and dimensions.

3. The process of claim 2, wherein said step of pressing comprises imparting to said body through holes and cavities desired in said components.

4. The process of claim 1, which further comprises plating said body as sintered and without trimming or reshaping said body.

5. The process of claim 2, wherein said pressing comprises compacting said volume into a mold at room temperature.

6. The process of claim 5, wherein said pressing further comprises using a mold defining said desired shape and dimensions.

7. The process of claim 6, wherein said pressing comprises compacting said volume under a pressure ranging from 1,350 atmospheres to 3,400 atmospheres (20,000 lbs/in$^2$ and 50,000 lbs/in$^2$).

8. The process of claim 6, wherein said selecting comprises selecting said first metal from a group consisting of metals and alloys having a coefficient of thermal conductivity of at least 200 w/m°K., and a melting point of less than 1,500° C.

9. The process of claim 8, wherein said first metal is selected from a group consisting of aluminum, copper, gold, silver, and alloy thereof.

10. The process of claim 8, wherein said selecting comprises selecting said second metal from a group consisting of metals and alloys having an average coefficient of thermal expansion of less than $10^{-5}/°C$.

11. The process of claim 10, wherein said second metal is selected from a group consisting of tungsten and molybdenum.

12. The process of claim 10, wherein said selecting comprises selecting a mixture having a ratio of first to second metals calculated to yield a specific range of average coefficient of thermal expansion for said article of manufacture falling between $4 \times 10^{-6}/°C$ and $11 \times 10^{-6}/°C$.

13. The process of claim 12, wherein:

said selecting comprises selecting copper as said first metal and tungsten as said second metals; and said sintering comprises sintering under a temperature between 1,090° C. to 1,230° C.

14. The process of claim 12, wherein said step of selecting comprises selecting an aggregate powder consisting of particles of the first and second metals, breakably bonded together into nodules, and sub-nodules.

15. The process of claim 12, wherein said step of selecting comprises selecting said aggregate wherein each of said particles has a diameter of no more than 2.5 microns.

16. The process of claim 15, wherein said step of selecting comprises selecting said aggregate including free-flowing nodules having an average diameter of no more than 350 microns.

17. In the process of manufacturing a heat-dissipating component for a microelectric device by pressing and sintering a volume of a powder of preclustered nodules grouping particles of copper and particles of a second metal having lower coefficient of thermal expansion and a higher melting point than copper, an improvement which comprises:

using such a powder wherein each of said nodules comprises an agglutinate of sub-nodules, each sub-nodule including at least one particle of copper and at least one said second metal.

18. The improvement of claim 17 which further comprises:

sintering said volume under a temperature between 1085° C. and 1230° C.

* * * * *